United States Patent
Campi, Jr. et al.

(10) Patent No.: US 9,236,374 B2
(45) Date of Patent: Jan. 12, 2016

(54) FIN CONTACTED ELECTROSTATIC DISCHARGE (ESD) DEVICES WITH IMPROVED HEAT DISTRIBUTION

(71) Applicant: INTERNATIONAL BUSINESS MACHINES CORPORATION, Armonk, NY (US)

(72) Inventors: John B. Campi, Jr., Westford, VT (US); Robert J. Gauthier, Jr., Hinesburg, VT (US); Rahul Mishra, Essex Junction, VT (US); Souvick Mitra, Essex Junction, VT (US); Mujahid Muhammad, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 94 days.

(21) Appl. No.: 14/146,421

(22) Filed: Jan. 2, 2014

(65) Prior Publication Data
US 2015/0187753 A1    Jul. 2, 2015

(51) Int. Cl.
*H01L 21/8238* (2006.01)
*H01L 27/02* (2006.01)
*H01L 29/66* (2006.01)
*H01L 23/367* (2006.01)

(52) U.S. Cl.
CPC ........ *H01L 27/0262* (2013.01); *H01L 23/3677* (2013.01); *H01L 27/0255* (2013.01); *H01L 29/66545* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 6,462,381 B1 | 10/2002 | Beebe et al. | |
| 6,835,967 B2 | 12/2004 | Yeo et al. | |
| 7,687,859 B2 | 3/2010 | Russ et al. | |
| 7,700,449 B2 * | 4/2010 | Lee ................. | H01L 21/823431 257/350 |
| 7,838,939 B2 | 11/2010 | Russ et al. | |
| 7,923,266 B2 | 4/2011 | Thijs et al. | |
| 7,964,893 B2 | 6/2011 | Lee | |
| 2009/0174000 A1 | 7/2009 | Ohguro | |

* cited by examiner

*Primary Examiner* — Jack Chen
(74) *Attorney, Agent, or Firm* — Michael LeStrange; Andrew M. Calderon; Roberts Mlotkowski Safran & Cole, P.C.

(57) ABSTRACT

Fin contacted electrostatic discharge (ESD) devices with improved heat distribution and methods of manufacture are disclosed. The method includes forming a plurality of fins on a substrate which is aligned with at least one well region in the substrate. The method further includes forming at least one electrostatic discharge (ESD) device spanning two or more of the plurality of fins. The forming of the ESD device includes forming an epitaxial material spanning the two or more of the plurality of fins and forming one or more contacts on the epitaxial material.

19 Claims, 6 Drawing Sheets

FIN CONTACTED ELECTROSTATIC DISCHARGE (ESD) DEVICES WITH IMPROVED HEAT DISTRIBUTION

FIELD OF THE INVENTION

The invention relates to semiconductor structures and, more particularly, to fin contacted electrostatic discharge (ESD) devices with improved heat distribution and methods of manufacture.

BACKGROUND

The semiconductor industry has been able to maintain steady improvements of device performance by scaling of silicon-based devices. One such method of improving device performance has been the advent of finFETs. FinFETs are three dimensional (3D) devices, which include a plurality of gate structures spanning over a plurality of fins. FinFETs are capable of providing a multi-gate architecture for technology-scaling below 45 nm due to its exceptional control of Short Channel Effects (SCE) and its compatibility with standard CMOS processing.

FinFETs, though, lead to smaller silicon volume which may lead to device degradation due to inadequate heat dissipation, particularly when used with ESD devices. For example, ESD devices generate large quantities of heat due to the application of high currents and voltages. In conventional fabrication processes, the ESD devices are placed on a planar region of a substrate in order to adequately dissipate these high heat requirements into the substrate, itself. But to provide such a configuration in finFET technologies, special processes are required which leads to process integration complexity issues.

SUMMARY

In an aspect of the invention, a method comprises forming a plurality of fins on a substrate which is aligned with at least one well region in the substrate. The method further comprises forming at least one electrostatic discharge (ESD) device spanning two or more of the plurality of fins. The forming of the ESD device comprises forming an epitaxial material spanning the two or more of the plurality of fins and forming one or more contacts on the epitaxial material.

In an aspect of the invention, a method comprises forming at least one well region in a substrate. The method further comprises forming a plurality of fins over the at least one well region. The method further comprises forming a plurality of ESD devices spanning sets of the plurality of fins. The forming of the plurality of ESD devices comprises growing epitaxial material on the sets of the plurality of fins and forming contacts on the epitaxial material. The method further comprises forming metal gate structures spanning the plurality of fins and separating each of the plurality of ESD devices along lengths of the sets of the plurality of fins. The method further comprises forming shallow trench isolation structures within the at least one well region and between each of the plurality of fins.

In an aspect of the invention, a structure comprises: a substrate; a well implant in the substrate; a set of P+ fins on the well; a set of N+ fins on the well; a plurality of shallow trench isolation (STI) structures formed in the substrate, separating the N+ fins and the P+ fins; and at least one electrostatic discharge (ESD) device spanning two or more of the set of P+ fins or set of N+ fins.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the fin contacted electrostatic discharge (ESD) devices, which comprises the structures of the present invention. In still further embodiments, a method in a computer-aided design system is provided for generating a functional design model of the fin contacted ESD devices. The method comprises generating a functional representation of the structural elements of the fin contacted ESD devices.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIGS. 1-4a show processing steps and respective structures in accordance with aspects of the present invention;

DETAILED DESCRIPTION

The invention relates to semiconductor structures and, more particularly, to fin contacted electrostatic discharge (ESD) devices with improved heat distribution and methods of manufacture. More specifically, the present invention is directed to a fin-based diode or fin based silicon controlled rectifier (SCR), both with ESD devices having improved heat distribution capabilities to the underlying wafer, e.g., silicon. The ESD devices of the present invention can span across plural fins, while dissipating its generated heat into the underlying wafer. By providing improved heat distribution capabilities, premature failure of the ESD devices is prevented. Also, advantageously, the ESD devices of the present invention are easily integrated into current processes of record for fin technologies, hence not requiring any special processes which would otherwise lead to integration complexity issues.

The fin contacted ESD devices of the present invention can be manufactured in a number of ways using a number of different tools. In general, though, the methodologies and tools are used to form structures with dimensions in the micrometer scale. The methodologies, i.e., technologies, employed to manufacture the FIN contacted ESD devices of the present invention have been adopted from integrated circuit (IC) technology. For example, the structures of the present invention are built on wafers and are realized in films of material patterned by photolithographic processes on the top of a wafer. In particular, the fabrication of the FIN contacted ESD devices of the present invention uses three basic building blocks: (i) deposition of thin films of material on a substrate, (ii) applying a patterned mask on top of the films by photolithographic imaging, and (iii) etching the films selectively to the mask.

Figure 1:
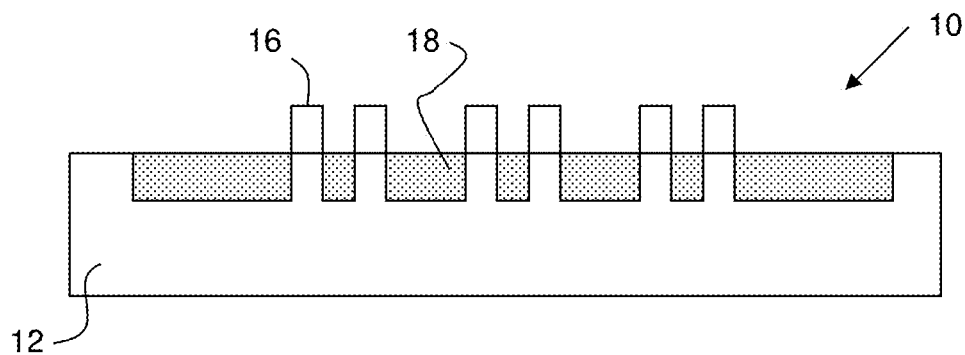

FIG. 1 shows a structure and respective processing steps in accordance with aspects of the present invention. In particular, the structure 10 includes a wafer 12. In embodiments, the wafer (substrate) 12 is a silicon wafer. A plurality of fins 16 are formed on the wafer 12. In embodiments, the plurality of fins 16 can be formed into N+ fins and P+ fins as described in further detail below.

The plurality of fins 16 can be formed using conventional processes such as, for example, sidewall image transfer (SIT) processes or other conventional lithography processes. For example, in embodiments, silicon material can be deposited on the wafer 12 using conventional deposition processes, e.g., chemical vapor deposition (CVD) processes. After deposition of the silicon material, a resist is formed on the silicon material which is exposed to energy (light) to form a pattern (openings). An etching process, e.g., reactive ion etching (RIE), is then performed through the openings to form the fins 16. In embodiments, the dimensions and orientations of the fins 16 can vary depending on the design specifications. For example, the fins can be parallel to one another and can be about 10 nm to 20 nm in width; although, other dimensions are also contemplated by the present invention. The resist is stripped using oxygen ashing processes, for example.

Still referring to FIG. 1, shallow trench isolation (STI) structures 18 are formed in the wafer 12, isolating each of the fins 16. In embodiments, the STI structures 18 are formed using conventional lithography, etching and deposition methods. For example, a resist is deposited and patterned as noted above, and thereafter the wafer 12 undergoes an etching process to form shallow trenches therein. The shallow trenches are filled with an oxide material or other insulator material to form the STI structures 18. The resist is then stripped using oxygen ashing processes, for example.

Figure 2:
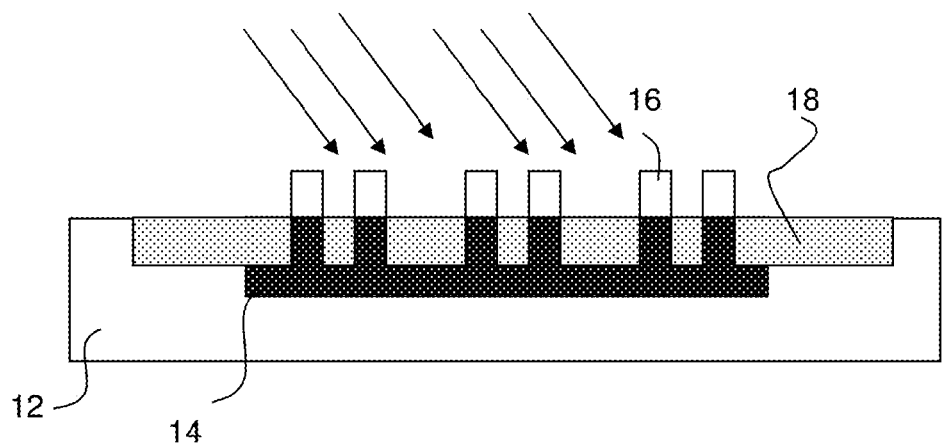

In FIG. 2, a well region 14 is formed in the wafer 12, under the fins 16. In embodiments, the wafer (substrate) 12 is a silicon wafer and the well region 14 is an N-well region. It should be understood by those of skill in the art, though, that the well region 14 can be a P-well region. In embodiments, the well region 14 can be formed using conventional ion implanting processes denoted by the arrows. For example, for an N-well region, phosphorus atoms are implanted into the wafer 12, in areas defined by a mask. In a P-well region process, on the other hand, the wafer is subjected to a boron implant which creates P-well regions.

Figure 3:
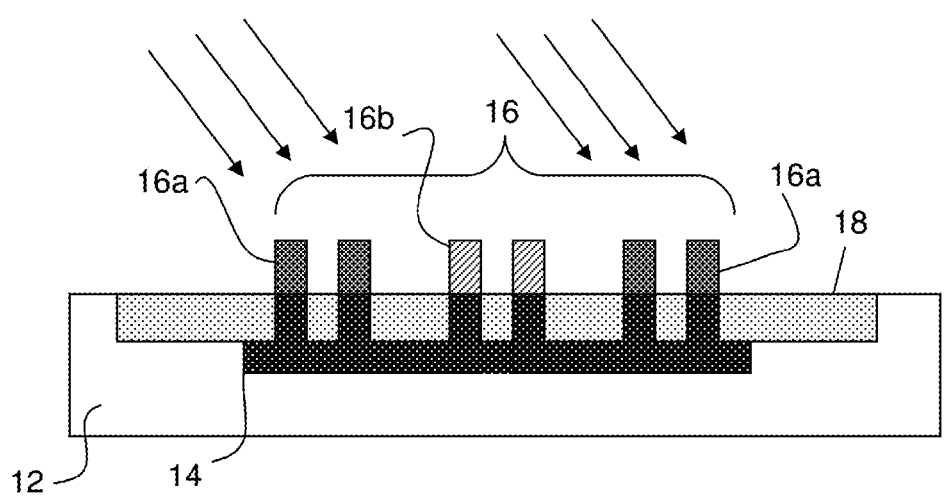

In FIG. 3, the fins 16 are formed into, e.g., N+ fins 16a and P+ fins 16b, respectively, by a conventional implantation process. In embodiments, the N+ fins 16a and P+ fins 16b can be formed using conventional masking processes, followed by ion implanting processes denoted by the arrows.

Figure 4A:
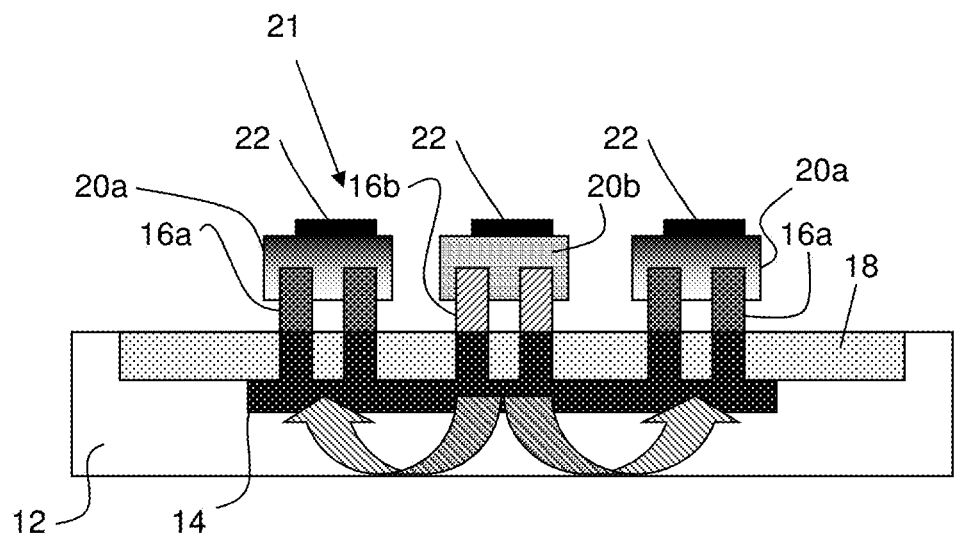
Figure 4B:
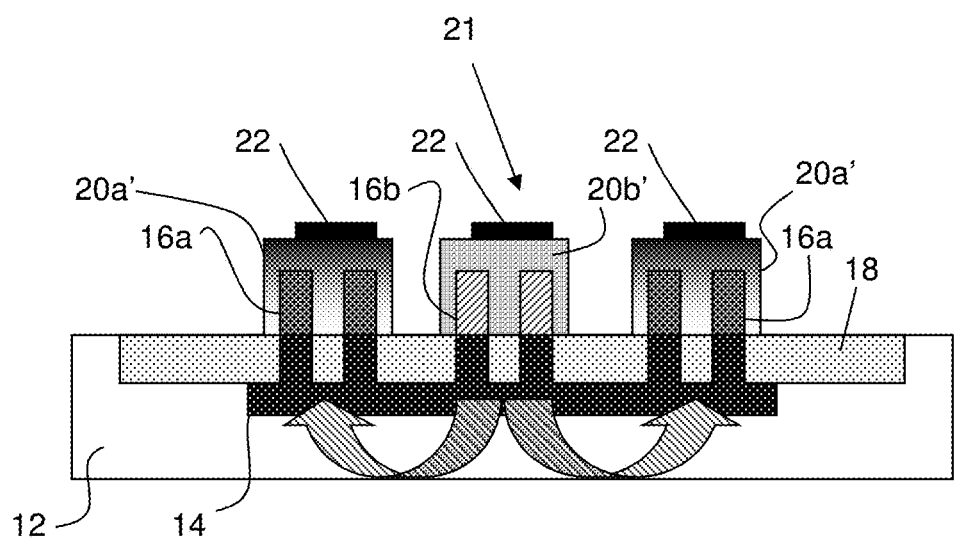
FIG. 4b shows processing steps and a respective structure in accordance with additional aspects of the present invention.

FIGS. 4a and 4b show anode (P+) and/or cathode (N+) regions of an ESD device 21 formed directly in contact with the fins 16a, 16b. In embodiments, the ESD devices 21 of the present invention include doped epitaxially grown material and metal contacts, both spanning plural or sets of silicon fins along their lengths. By spanning plural silicon fins, total silicon volume of the ESD devices 21 is increased, thus increasing the dissipation or distribution of heat generated from the ESD devices 21. Epitaxial material can be grown in various shapes as shown in FIGS. 4a and 4b as examples.

Although each of the ESD devices 21 are shown to span two fins (e.g., a pair fins), it should be understood by those of skill in the art that the ESD devices 21 can span any number (set) of fins along their lengths, depending on the design specifications. Also, there can be any number of fins between respective ESD devices 21, and/or any number of ESD devices 21 along the length of any of the pairing combinations of adjacent fins. Accordingly, FIGS. 4a and 4b should be understood to be a representative structure of any of the different combination of fin structures and ESD devices 21 contemplated by the present invention.

To form the ESD devices 21 of FIGS. 4a and 4b, a silicon seed layer is formed on the N+ fins 16a and P+ fins 16b and, thereafter, an epitaxial material, e.g., silicon, is grown on the N+ fins 16a and P+ fins 16b. In embodiments, due to the doping concentration of the N+ fins 16a and P+ fins 16b, the epitaxial material will result in an N-doped epitaxial material 20a (or 20a') or a P-doped epitaxial material 20b (or 20b'). Also, depending on factors such as the dimensions and spacing of the N+ fins 16a and P+ fins 16b and the growth time period, the epitaxial material 20a', 20b' of FIG. 4b can grow directly onto the underlying wafer 12, while the growth of the epitaxial material 20a, 20b of FIG. 4a will leave a space above the underlying wafer 12.

Still referring to FIGS. 4a and 4b, contacts 22 are formed on the N-doped epitaxial material 20a (20a') and the P-doped epitaxial material 20b (20b') to form the ESD devices 21. In embodiments, the contacts 22 span between the fins and comprise any metal material such as tungsten or copper or other metal alloys. The contacts 22 can be formed by self aligned contact (SAC) processes, followed by an anneal process as is known by those of skill in the art. As represented by the arrows, by implementing the structures of the present invention, heat generated by the ESD devices 21 will be effectively dissipated into the wafer 12 due to increased surface area contact between the silicon and ESD devices.

Figure 5A:
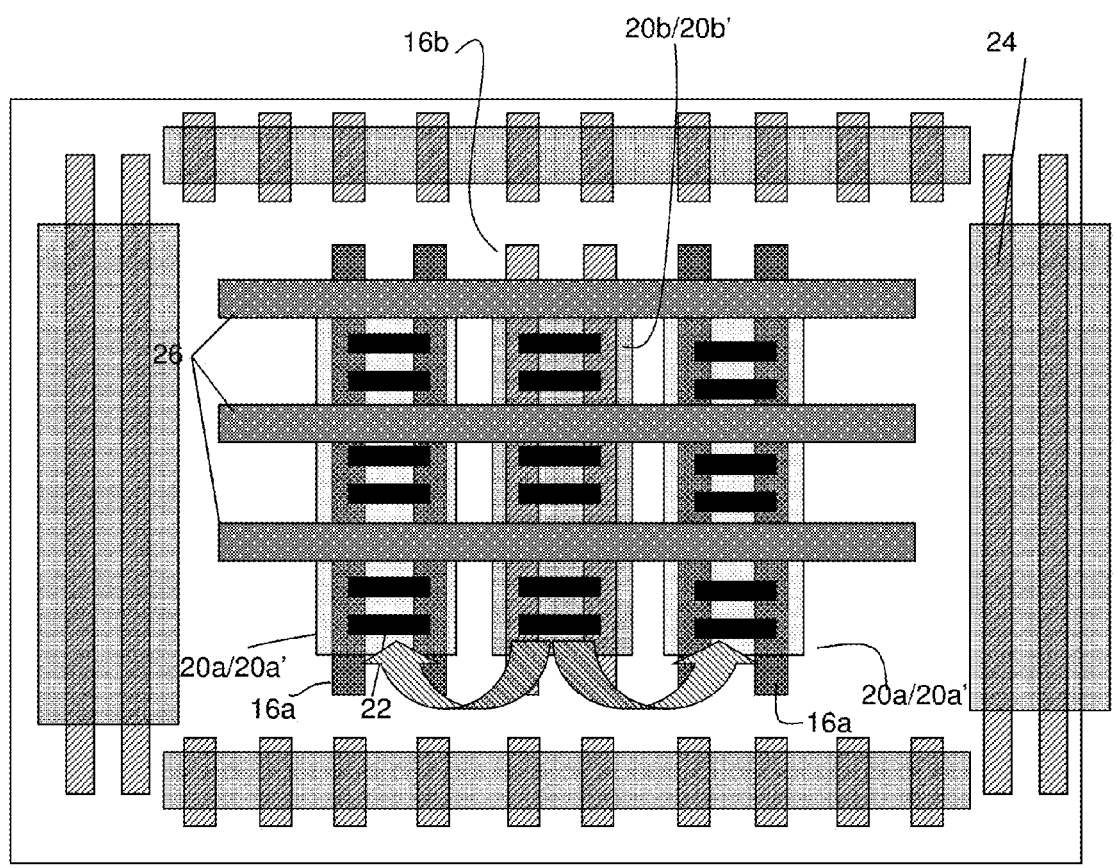
FIGS. 5a and 5b show a top view of the structure of FIG. 4a or FIG. 4b, with additional processing steps in accordance with aspects of the present invention.
Figure 5B:
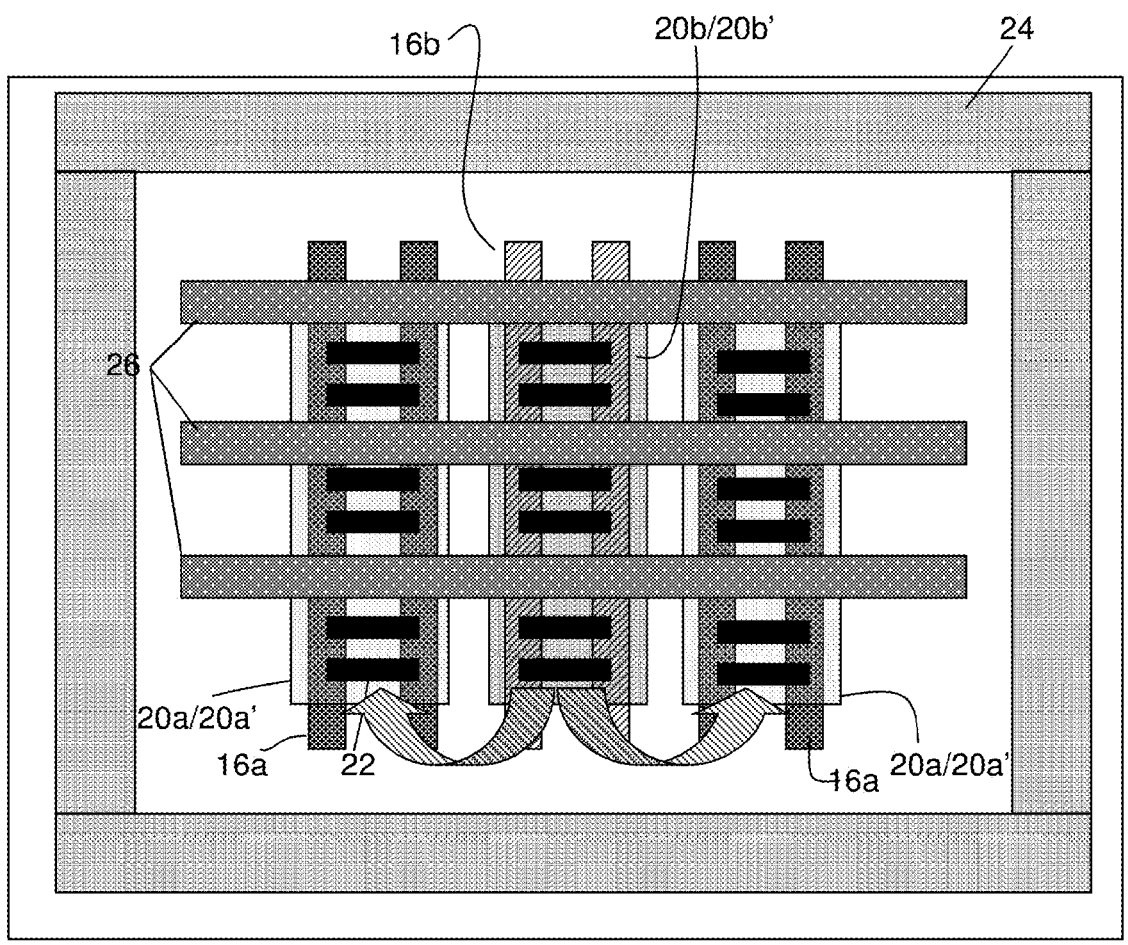

FIGS. 5a and 5b show a top view of the structure of FIG. 3a or FIG. 3b, with additional processing steps in accordance with aspects of the present invention. FIGS. 5a and 5b show a substrate guard ring 24, which can either be on a fin or on a planar semiconductor material, e.g., Si. More specifically, FIGS. 5a and 5b show the formation of metal gate structures 26 spanning the fins 16a, 16b. In embodiments, the metal gate structures 26 are formed by replacement gate processes. For example, after formation of the well region 14, fins 16 and STI structures 18, a dummy gate poly can be deposited and patterned on the structure(s). The epitaxial material described in FIGS. 4a and 4b can then be formed, with the patterned dummy gate poly acting as a boundary. After formation of the epitaxial material and contacts thereon, the dummy gate poly can be removed and replaced with a metal gate structure 26. Advantageously, the metal gate structures 26 provide additional heat dissipation, as they function as heat sinks.

Figure 6:
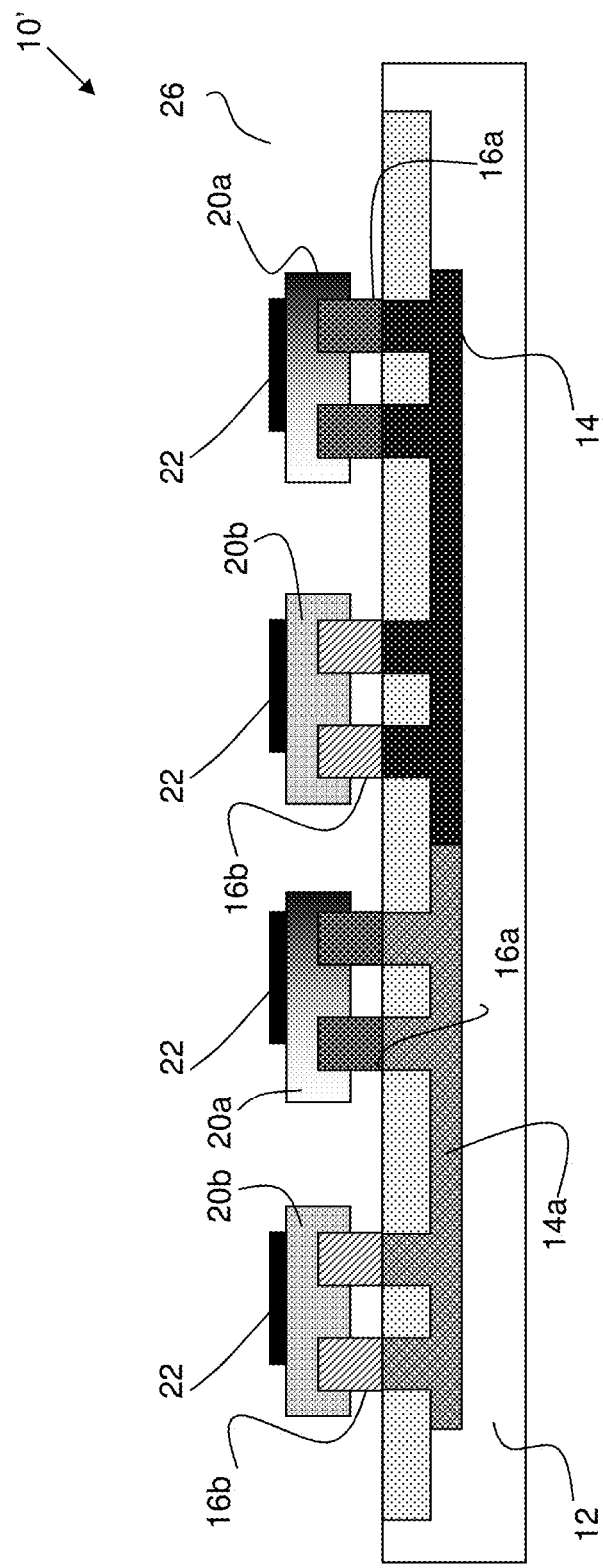
FIG. 6 shows processing steps and a respective structure in accordance with yet an additional aspect of the present invention.

FIG. 6 shows processing steps and a respective structure in accordance with an additional aspect of the present invention. In this aspect of the invention, the structure 10' of FIG. 6 is a fin based silicon controlled rectifier (SCR) with ESD devices 21 having improved heat distribution capabilities to the underlying wafer 12, e.g., substrate. In this implementation, the SCR includes an N-well region 14 abutting a P-well region 14a. Both the N-well region 14 and P-well region 14a include fins 16a and 16b formed in the processes described herein. The ESD devices 21 are formed directly in contact with the fins 16a, 16b, as also described herein with regard to FIGS. 4a and 4b. As described in FIGS. 4a and 4b, metal gate structures 26 span the fins 16a, 16b. Advantageously, the metal gate structures 26 provide additional heat dissipation, as they function as heat sinks.

Figure 7:
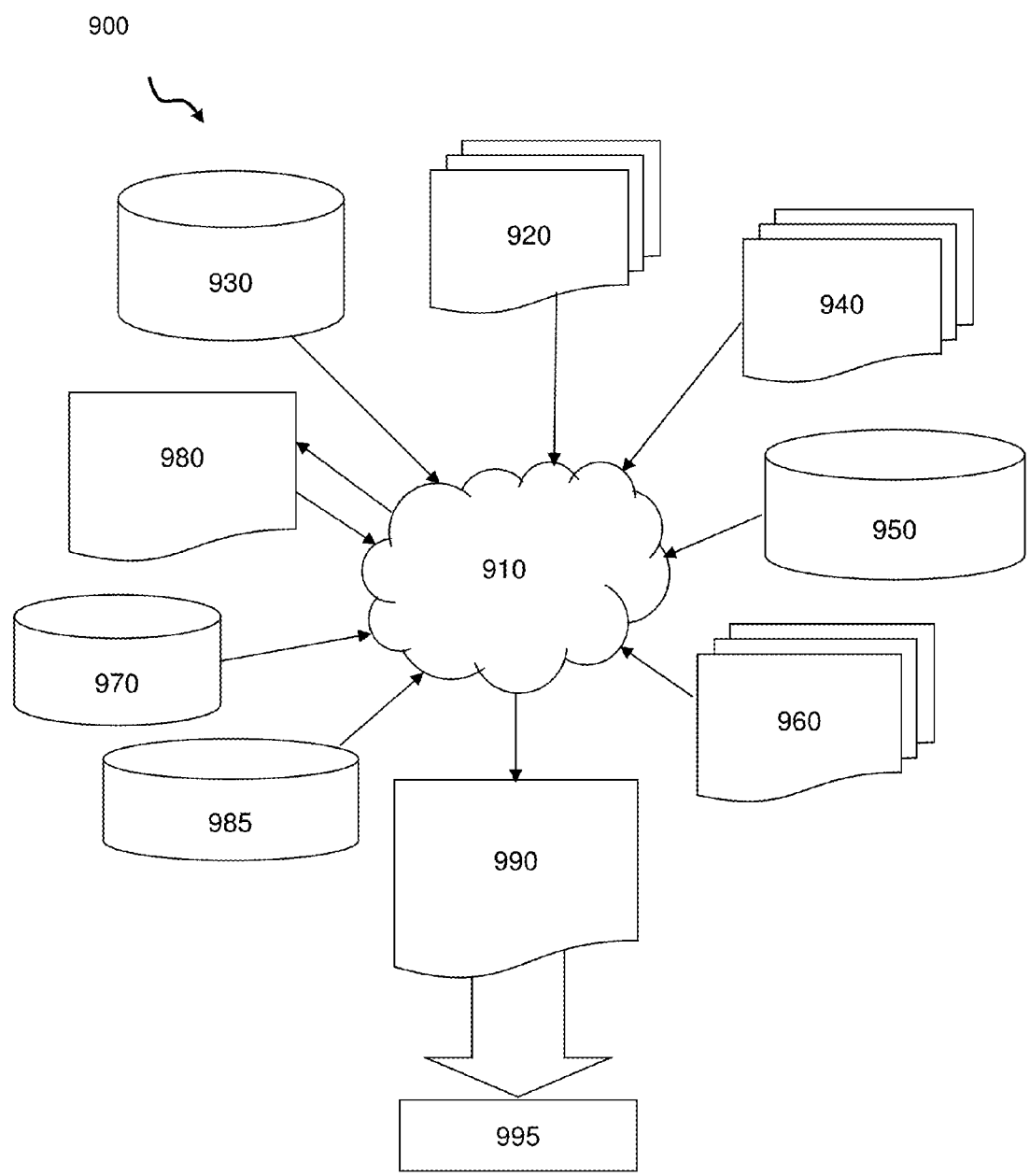
FIG. 7 is a flow diagram of a design process used in semiconductor design, manufacture, and/or test.

FIG. 7 is a flow diagram of a design process used in semiconductor design, manufacture, and/or test. FIG. 7 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-4*a*, 4*b*, 5 and 6. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) tool such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-4*a*, 4*b*, 5 and 6. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-4*a*, 4*b*, 5 and 6 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-4*a*, 4*b*, 5 and 6. In one embodiment, design structure 990 may comprise a compiled, executable HDL simulation model that functionally simulates the devices shown in FIGS. 1-4*a*, 4*b*, 5 and 6.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-4*a*, 4*b*, 5 and 6. Design structure 990 may then proceed to a stage 995 where, for example, design structure 990: proceeds to tape-out, is released to manufacturing, is released to a mask house, is sent to another design house, is sent back to the customer, etc.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming a plurality of fins on a substrate comprising at least a pair of P+ fins and at least a pair of N+ fins which are aligned with at least one well region in the substrate; and
   forming at least one electrostatic discharge (ESD) device spanning two or more of the plurality of fins, wherein the forming of the ESD device comprises:
      forming an epitaxial material spanning the two or more of the plurality of fins; and
      forming one or more contacts on the epitaxial material.

2. The method of claim 1, further comprising forming a device bounded by shallow trench isolation (STI) structures in the substrate, in FinFET technology.

3. The method of claim 2, wherein the STI bounded device is formed with a buried channel which increases an Si volume in FinFET technology.

4. The method of claim 3, wherein the STI bounded device with the buried channel provides improved heat dissipation in FinFET technology.

5. The method of claim 1, wherein the at least one well region is two well regions comprising forming an N-well region abutting against a P-well region.

6. The method of claim 5, wherein:
   the at least a pair of P+ fins and the at least a pair of N+ fins are formed in the N-well region and the P-well region; and
   the at least one ESD device spans between the at least pair of P+ fins in the N-well region and the P-well region and the at least pair of the N+ fins in the N-well region and the P-well region.

7. The method of claim 5, further comprising forming a gate structure adjacent to the at least one ESD device, the gate structure spanning the plurality of fins.

8. The method of claim 7, further comprising forming shallow trench isolation structures in the substrate separating each of the plurality of fins.

9. The method of claim 1, wherein the forming of the epitaxial material is a growth process which grows the epitaxial material into direct contact with the substrate.

10. The method of claim 1, wherein the forming of the epitaxial material is a growth process which grows the epitaxial material above the substrate.

11. The method of claim 1, wherein the at least one well region is an N-well region and the at least a pair of P+ fins and the at least a pair of N+ fins are formed on the N-well region.

12. The method of claim 11, wherein the at least one ESD device spans between the at least pair of P+ fins on the N-well region and at least two separate pairs of the N+ fins on the N-well region, and further comprising forming a gate structure adjacent to the at least one ESD device, the gate structure spanning the plurality of fins and forming a heat sink to dissipate heat generated from the at least one ESD device to the substrate, wherein the forming the gate structure includes a replacement gate process.

13. The method of claim 12, further comprising forming shallow trench isolation structures within the N-well region and between each of the plurality of fins.

14. A method comprising:
   forming at least one well region in a substrate;
   forming a plurality of fins over the at least one well region comprising at least a pair of P+ fins and at least a pair of N+ fins;
   forming a plurality of ESD devices spanning sets of the plurality of fins, the forming of the plurality of ESD devices comprises:
      growing epitaxial material on the sets of the plurality of fins; and
      forming contacts on the epitaxial material;
   forming metal gate structures spanning the plurality of fins and separating each of the plurality of ESD devices along lengths of the sets of the plurality of fins; and
   forming shallow trench isolation structures within the at least one well region and between each of the plurality of fins.

15. The method of claim 14, wherein the at least one well region is two well regions, including an N-well region abutting against a P-well region.

16. The method of claim 15, wherein:
   the at least a pair of P+ fins and the at least a pair of N+ fins are formed in the N-well region and the P-well region; and
   the plurality of ESD devices span between the at least pair of P+ fins in the N-well region and the P-well region and the at least pair of N+ fins in the N-well region and the P-well region.

17. The method of claim 14, wherein the forming of the epitaxial material is a growth process.

18. The method of claim 14, wherein:
the at least one well region is an N-well region and the at least pair of P+ fins and the at least pair of N+ fins are formed on the N-well region; and each of the plurality of ESD devices span between the at least pair of P+ fins on the N-well region and at least two separate pairs of the N+ fins on the N-well region.

19. The method of claim 18, wherein the metal gate structures are adjacent to each of the plurality of ESD devices and act as heat sinks to dissipate heat generated from the ESD devices into the substrate.

* * * * *